United States Patent [19]

Deckers

[11] Patent Number: 4,763,400
[45] Date of Patent: Aug. 16, 1988

[54] MACHINE FOR THE SELECTIVE INSERTION OF ELECTRICAL CONTACT PINS INTO A PRINTED CIRCUIT PLATE

[75] Inventor: Willy Deckers, Aarschot, Belgium
[73] Assignee: Burndy Corporation, Norwalk, Conn.
[21] Appl. No.: 932,937
[22] Filed: Nov. 20, 1986
[30] Foreign Application Priority Data
  Nov. 29, 1985 [BE] Belgium .............................. 0/215930
[51] Int. Cl.⁴ ............................................. H05K 3/30
[52] U.S. Cl. ................................... 29/564.6; 29/739; 29/845
[58] Field of Search ..................... 29/739, 741, 564.6, 29/759, 837, 845, 566.1, 566.2

[56] References Cited
U.S. PATENT DOCUMENTS
  4,265,508  5/1981  Chisholm ........................ 339/221 R
  4,287,668  9/1981  Asai et al. ............................ 29/838
  4,612,700  9/1986  Loomis et al. ..................... 29/564.6
  4,653,664  3/1987  Hineno et al. ..................... 29/759 X FOREIGN PATENT DOCUMENTS
  3424323  1/1985  Fed. Rep. of Germany .
  2020583  11/1979  United Kingdom .

Primary Examiner—Carl E. Hall
Attorney, Agent, or Firm—Perman & Green

[57] ABSTRACT

The machine is equipped with a programmable X-Y table (10), an intermittently rotatable distribution head (20) mounted on top of this table, equipped with a mechanism for gripping a contact pin (14) and inserting this pin into a plate, a feeding device (30) which is laterally movable with respect to this distribution head (20) for automatic and selective feeding of at least two different kinds of pins and an anvil mechanism (80) mounted under the X-Y table (10) for stopping the pin on the bottom side of the printed circuit plate (12).

14 Claims, 8 Drawing Sheets

MACHINE FOR THE SELECTIVE INSERTION OF ELECTRICAL CONTACT PINS INTO A PRINTED CIRCUIT PLATE

THE BACKGROUND OF THE INVENTION

The invention refers to a machine and the accessory method for automatic and selective insertion of electrical contact pins of different nature or coating on previously programmed spots into a printed circuit plate.

STATE-OF-THE-ART

Up to the present the contact pins had to be pushed into the printed circuit plate either by hand or mechanically.

This mechanical insertion of pins was only possible for a certain type of pins so that pins with a special coating of earthing pins had to be inserted afterwards separately by hand. In order to simplify the operation as much as possible pins were therefore often used which were completely covered by a gold coating. For economical reasons it is justified, however, to provide pins which, according to their application, only have a partial gold coating or even none at all.

Purpose of this invention is to insert by means of a machine contact pins of different kind in a place destined for each of them into a printed circuit plate as accurately and quickly as possible.

SUMMARY

The machine according to the invention comprises principally:

a programmable X-Y table, which in itself is known and forms no part of the present invention, on which a printed circuit plate is fixed;

an intermittently rotating distribution head fixed on top of this table, provided with a mechanism for picking up a contact pin from a supplying device and for insertion of this pin into a printed circuit plate fixed on the X-Y table;

a supplying device which is laterally movable with respect to this distribution head for the automatic and selective supply of at least two different kinds of pins and provided with a mechanism for separate cutting from the supply line of a pin and for directing and aligning of this pin;

an anvil mechanism attached to the bottom of the X-Y table to stop the pin at the bottom of the printed circuit plate.

By means of a machine according to the present invention it becomes consequently possible to choose automatically from a number of different contact pins (different sizes, shape or coating) the pin suitable for a specific position or hole in the printed circuit plate, to feed this pin, cut if from the supply band or strip, pick it up and insert it after that into the plate on the spot set by the X-Y table.

It is for example possible to insert four different kinds of contact pins with an elastic fixing zone into a printed circuit plate in specific previously programmed spots. In general these contact pins have the same dimensions, but they are provided with a different coating, viz. completely gold-coated, only partially gold-coated or also without gold coating, or only covered with a lead-tin coating.

BRIEF DESCRIPTION OF THE DRAWINGS

The invention will be explained by the following description of a form of construction for which is referred to the attached drawings.

DETAILED DESCRIPTION OF THE INVENTION

Figure 1:
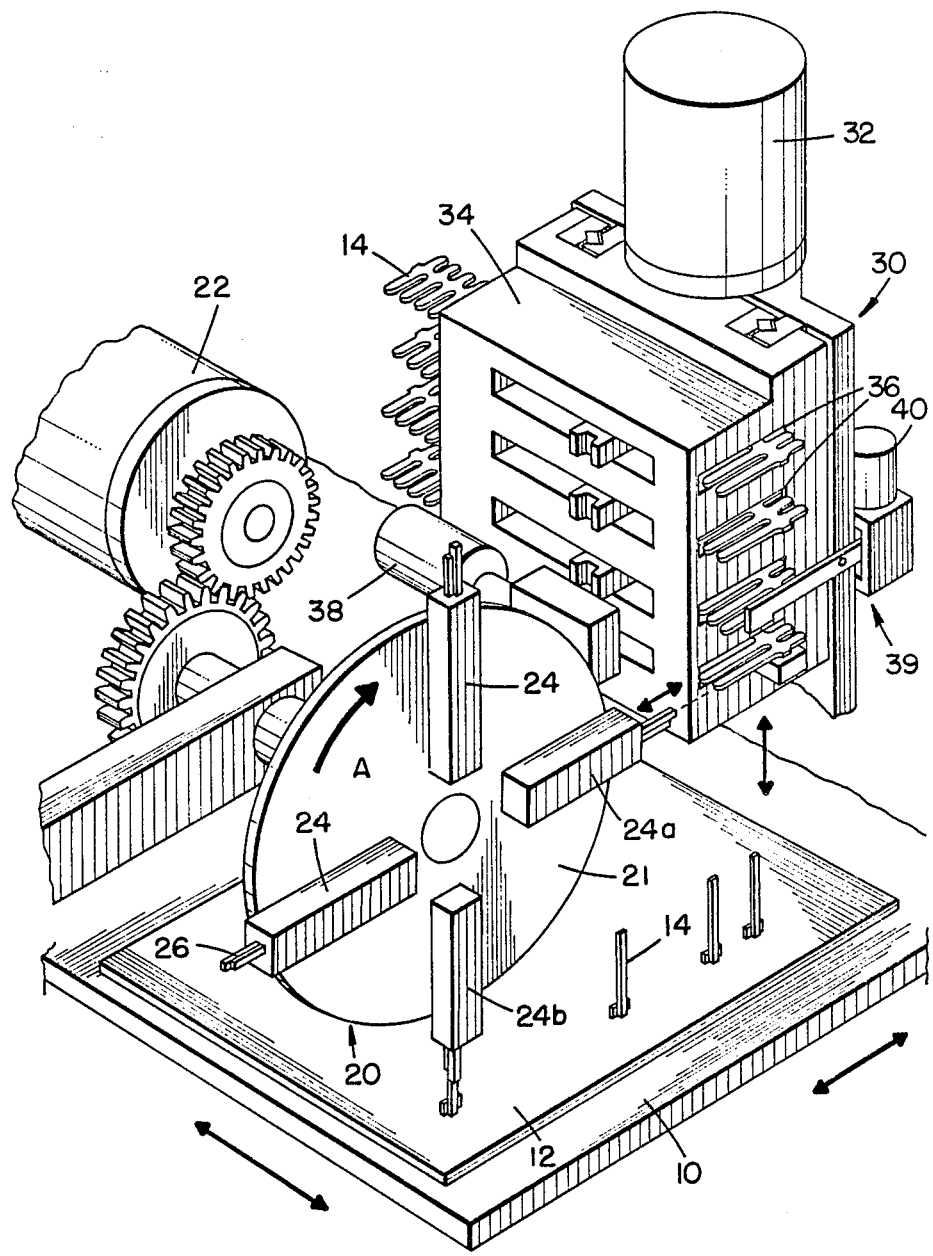
FIG. 1: is a diagram of the principle of a machine according to the invention.

According to FIG. 1 the machine comprises in accordance with the invention in principle the following parts:

an X-Y table 10 with printed circuit plate 12 attached to it;

a distribution head 20 consisting of an intermittently rotatable wheel 102 driven by a motor 22 and equipped with a number of radial arms and with movable gripping- and insertion devices 26;

a magazine holder 30 mounted sideways of this distribution head 20, with a magazine 34 which is vertically movable by a motor 32 and equipped for example with four superposed feeding- and guiding slots 36 for various kinds of pins 14, a feeding mechanism 38 and a cutting mechanism 39 driven by a motor 40.

The distribution head 20 with four arms 24 is rotated by motor 22 step by step over 90° in the direction of arrow A.

During each stop one of the arms 24a which is in horizontal position opposite the magazine, can catch a fed and cut-off pin whereas at the same time one of the arms 24b which is orientated vertically towards the printed circuit plate inserts a pin picked up in the previous position into the hole in plate 12 intended for that purpose.

The movable magazine 34 takes care that each time the appropriate pin 14 is selected by adjusting the height alignment between the corresponding guiding slot 36 and the horizontal arm 24a.

As will be discussed further in the description it is also possible to adjust the insertion depth of specific types of pins. This depth adjustment, the selection of the vertical movement of the magazine as well as the horizontal movement of the printed circuit plate by the X-Y table are of course programmed beforehand in accordance with the printed circuit plate to be fabricated.

Figure 2:
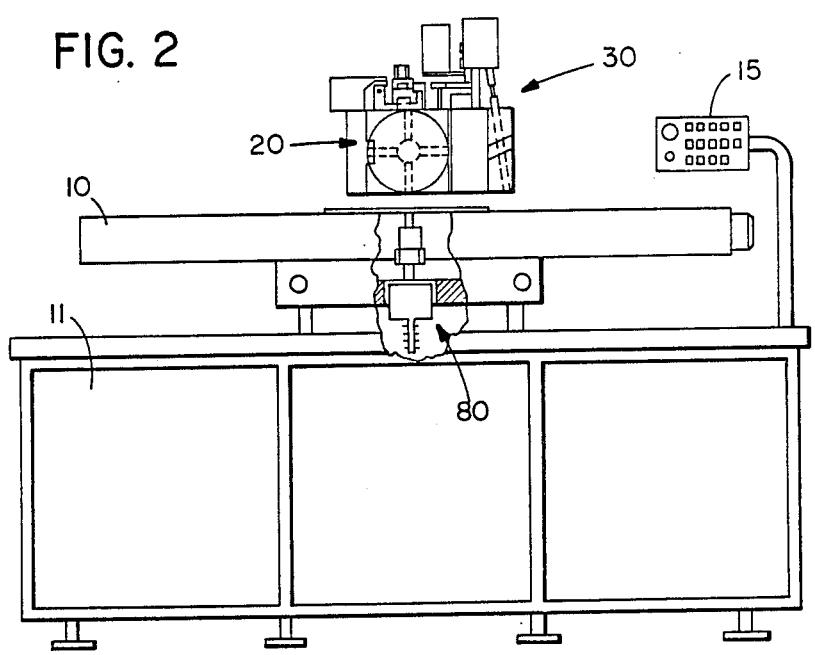
FIGS. 2 and 3: are respectively a front- and top view of a machine.
Figure 3:
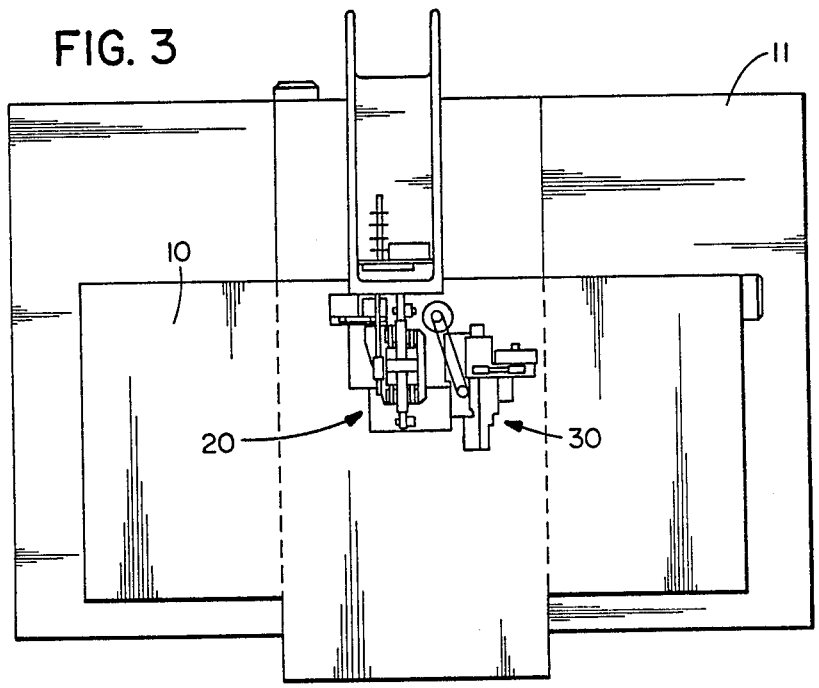

A practical form of construction of a machine according to the invention is shown in FIGS. 2, 3 and the following detail drawings.

According to these drawings the X-Y table 10 is mounted on an underframe 11 equipped with a control panel 15 of a self-contained machine.

Above the X-Y table 10 the distribution head 20 and the magazine holder 30 with their accessory control mechanisms are located. Under the X-Y table the anvil mechanism 80 is fixed. The distribution head 20 and its control mechanism are represented in FIGS. 4, 5, 7 and 8.

The housing 101 of this assembly contains a mechanism which is immersed in an oil bath and driven by an electric motor (DC motor) by way of a drive shaft 109.

Each time when this shaft 109 makes one turn the following movements are repeated:

wheel 102 of the distribution head, with four radial arms 24 and which is mounted on the front side on the housing 101, rotates over an angle of 90° in the direction of arrow A.

a lever 103 located above housing 101 is put in motion by a rod 104 protruding from the housing and making an up and down movement; this lever 103 drives in its turn a slide 105 which is mounted against the wheel 102 and which puts a radial arm 24b in motion. This arm 24b is at the moment underneath as indicated in FIG. 1 and drives the pin which it holds into the plate.

This slide also drives during its vertical movement a cross-slide 106. The way in which the vertical movement of slide 105 moves at the same time the radial arm 24b and the cross-slide 106 is elucidated by FIG. 7.

In this figure slide 105 is halfway its vertical downward movement. On the backside of slide 105 is an oblique groove 116 and the cross-slide 106 is equipped with a tooth 117 which can move in this oblique groove 116.

As cross-slide 106 can only move horizontally with respect to the distribution head 20 it will consequently be clear that because of a movement of slide 105 from the top downward and because of the concerted action of the oblique groove 116 and tooth 117 the cross-slide moves from left to right.

During its movement from left to right cross-slide 106 takes along radial arm 24a by means of a projection 121, fixed on each radial arm 24 and which in this case forms part of arm 24a moving in concert with a groove segment 119 of cross-slide 106.

During the movement of slide 105 from the top downward radial arm 24b is picked up by means of projection 121 of arm 24b and which moves in concert with a groove segment 120 of slide 105.

Groove segments 119 and 120 mentioned above form part of a circular groove 118 which is provided in both slides 105 and 106. When slide 105 is in the upper position and cross-slide 106 in the utmost left position, these groove segments 119 and 120 are in line with the circular groove 118 and wheel 102 of distribution head 20 together with the four radial arms 24 can rotate freely, as the respective projections 121 of arms 24 can then move freely in the circular groove 118.

Figure 8:
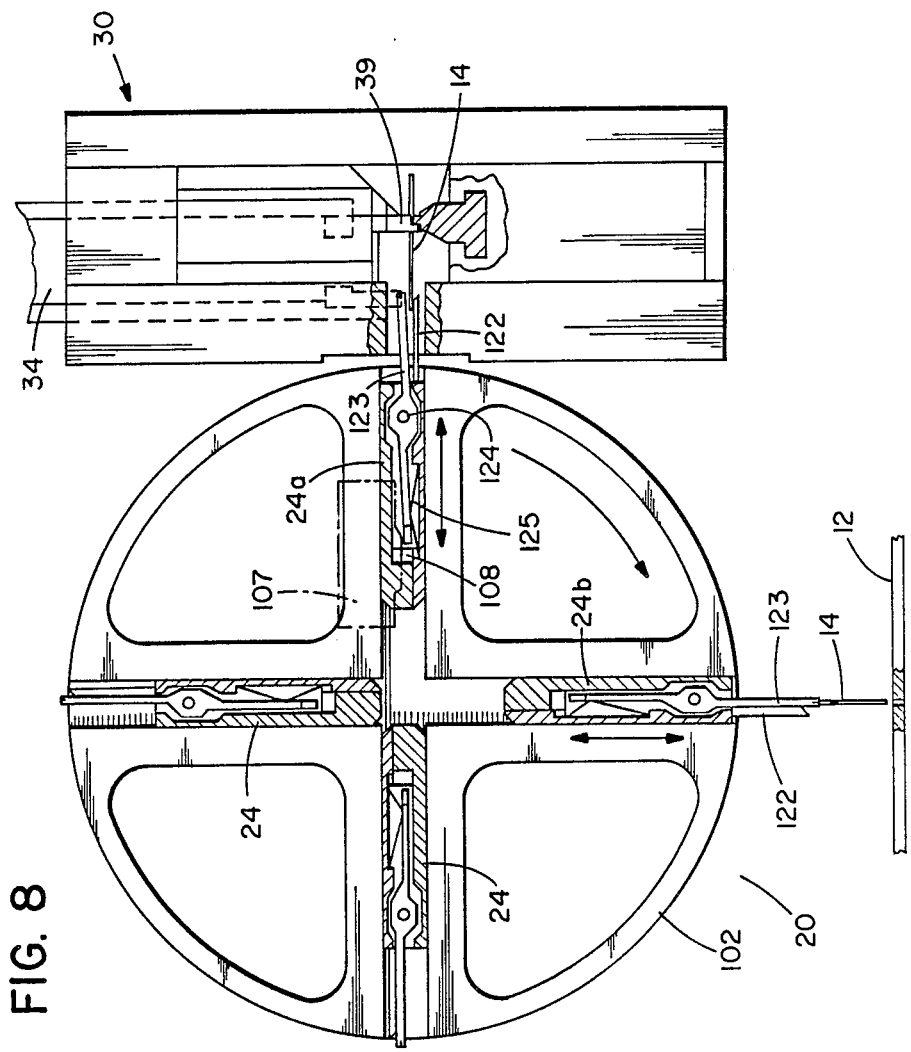

Each arm 24 is equipped with a fixed finger 122 and a hinged finger 123 as shown in FIG. 8. Hinged finger 123 can move around a spindle 124, which forms part of the arm, and is pressed under normal conditions against the fixed finger 122 by means of a spring 125. The end of hinged finger 123 pointing towards the center is provided with a pawl 108 which protrudes towards the back sticking out of wheel 102 which can move in concert with a cam 107 located behind wheel 102 and which can move towards the wheel or away from the wheel.

This cam 107 takes care of opening and closing the hinged finger 123 of arm 24a during the gripping and holding of a pin 14 from the magazine 34.

During the outward movement of arm 24a pawl 108 follows the curve of cam 107 in such a way that a given moment hinged finger 103 is opened against the working of spring 125. In this position which in fact is the extreme right position, a pin 14 is caught from magazine 34. At that moment hinged finger 123 is released and clamps pin 14 against fixed finger 122 by means of spring 125.

Figure 5:
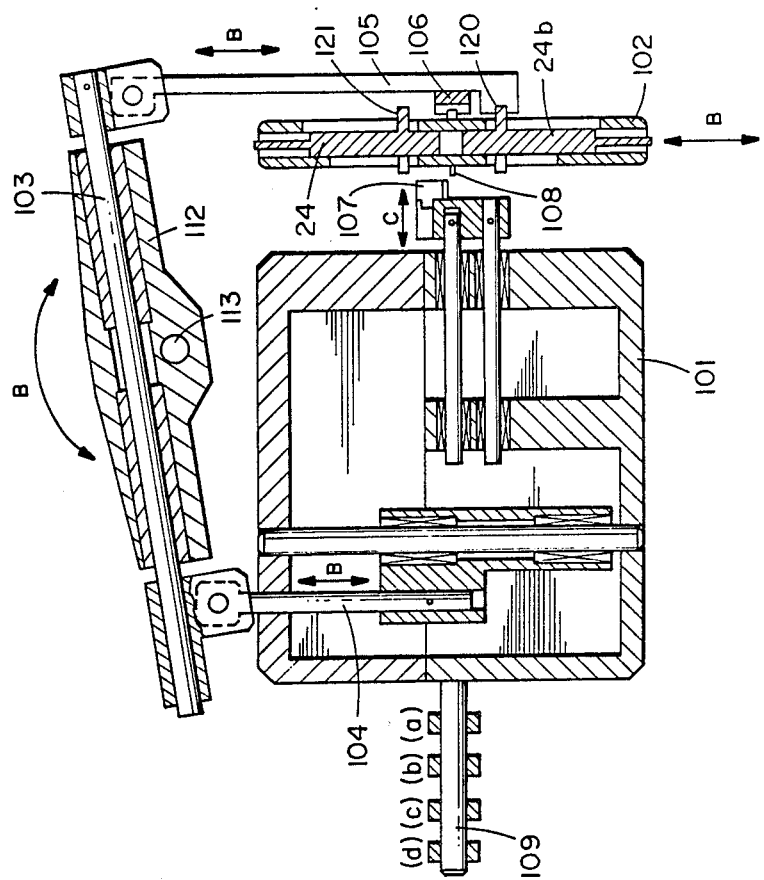
FIGS. 4 and 5: are respectively a front view and a longitudinal section of the distribution head.
Figure 4:
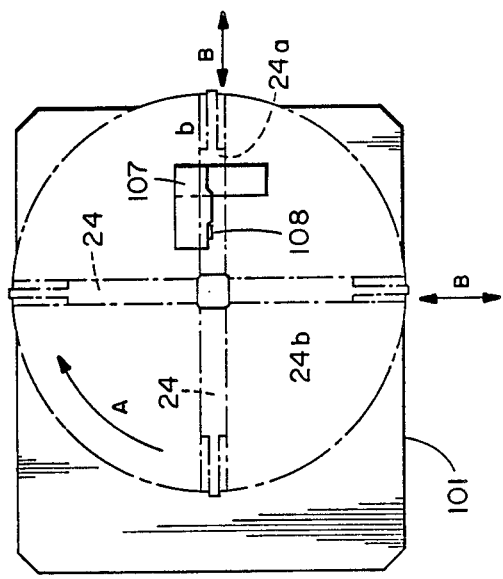
Figure 6:
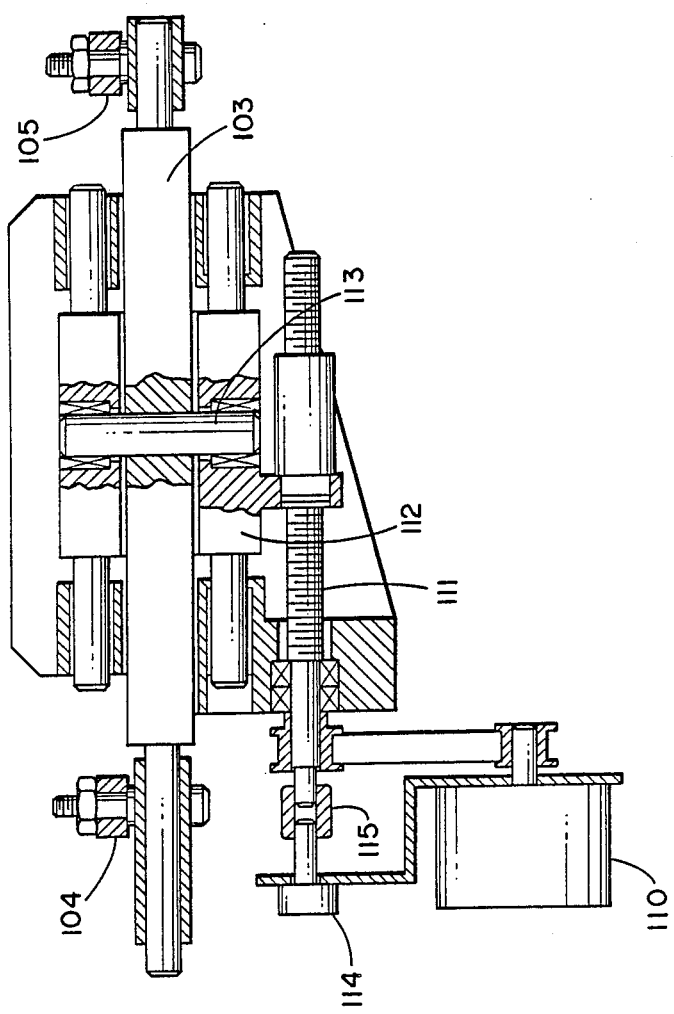
FIG. 6: is a detail drawing in top view of the depth adjustment of the pin.
Figure 7:
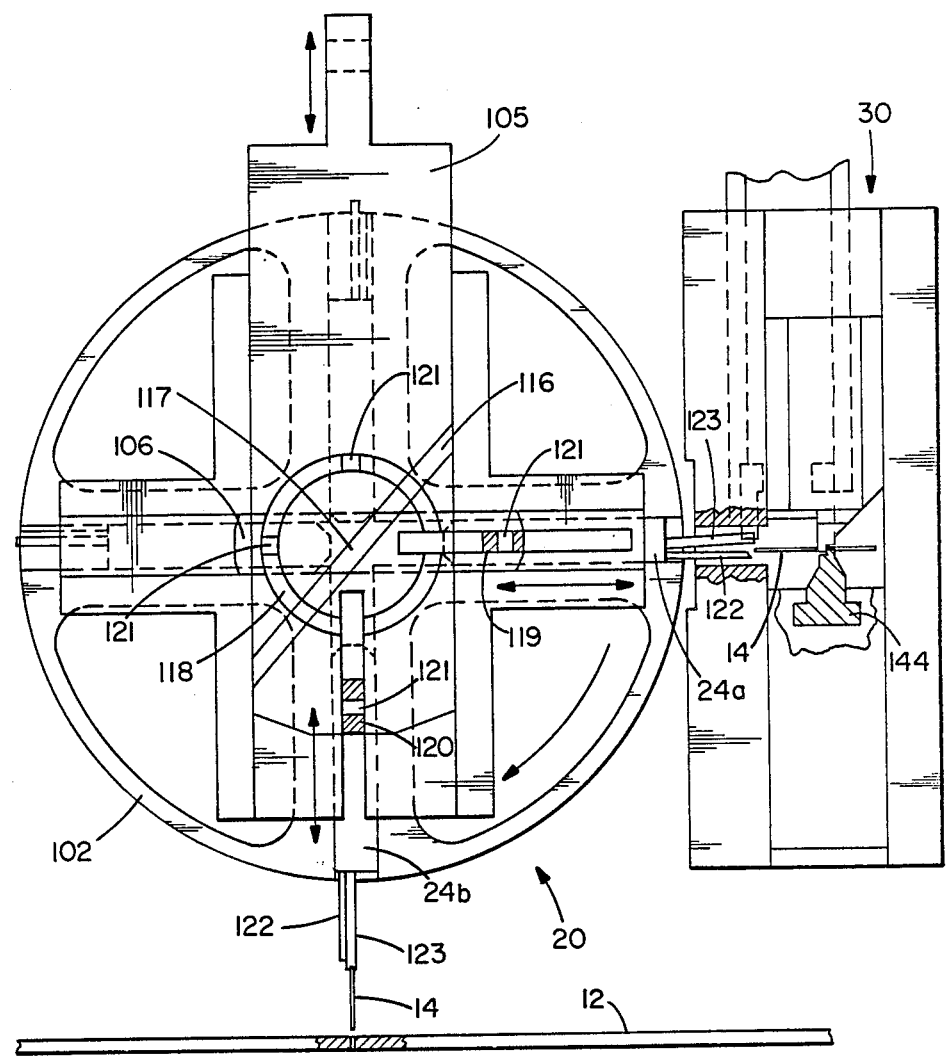
FIGS. 7 and 8: are the drawings in front view of the distribution head and part of the magazine to elucidate the operation of the pick-up and insertion mechanism.

Cam 107 which was positioned during the outward movement of arm 24a near wheel 102, is moved away at that moment from wheel 102 in such a way that pawl 108 no longer is in touch with the curve of the cam and consequently hinged finger 123 remains closed (movement according to arrow C in FIG. 5). During the gripping of a pin 14 by arm 24a, a pin 14 is thus also inserted into printed circuit plate 12 due to the vertical movement of slide 105 (movement according to arrow B in FIG. 5).

This movement is caused by the oscillating movement of lever 103 around spindle 113.

The front end of lever 103 is attached by a hinged connection to slide 105 and in the rear the lever is attached by a hinged connection to actuating rod 104.

In order to obtain a depth adjustment of the pins to be inserted, spindle 113 around which level 103 oscillates is mounted in a slide 112 which can move with respect to the lever in longitudinal direction.

The movement of this slide 112 is actuated by a separate motor 110, which drives a revolving ball rod 111 the screw-thread of which moves in concert with slide 112.

During a movement of slide 112 and consequently also of spindle 113 the one lever becomes shorter and the other longer or vice versa. Due to this movement a difference is obtained in insertion depth as the stroke of rod 104 which actuates the lever is constant. The adjustment of the insertion depth can be set accurately and can be controlled by a potentiometer 114 which is connected to the revolving ball rod 111 by means of a coupling.

Figure 9:
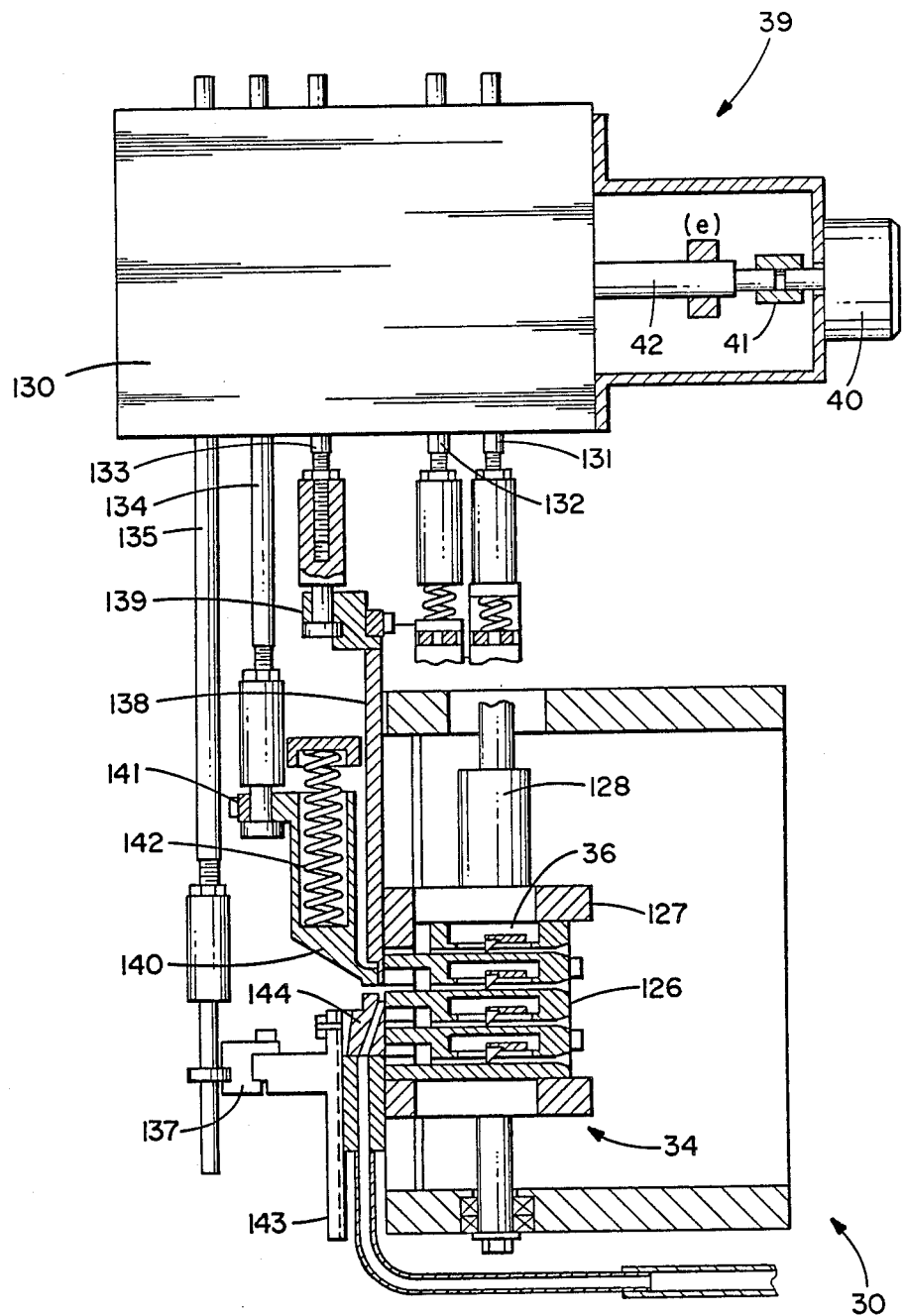
FIG. 9: is a vertical cross section of the supply magazine.

A construction of the feeding magazine 30 is shown in cross section in FIG. 9.

Magazine 30 comprises a vertically movable selector 126 provided with four guiding slots 36 along which strips with cut-out pins of various kinds can be fed.

The vertical position of each of the guiding slots 36 is regulated by a slide 127 which includes the selector 126 and which is actuated by a revolving ball rod 128 connected to the motor 32 (FIG. 1), preferably a DC motor with encoder. This motor ensures that guiding slot 36 is brought at the same level as cutting mechanism 39 with the appropriate strip of pins.

This cutting mechanism 39 must ensure that the pin supplied is cut from the carrying strip and that this cut-off pin remains clamped till it is taken over by the gripping fingers 122, 123 of arm 24a. For that purpose the cutting mechanism 39 is driven by a motor 40, preferably also a DC-motor with decoder, which drives a cam-operated mechanism 130 in an oil bath by way of a coupling 41 and a drive shaft 42.

According to a known method five rods are driven by this cam-operated mechanism, which must ensure the feeding, clamping and cutting of the pins. these rods are:

rod 131 for feeding, that is: for the feed-through of the selected strip with the width of a pin (2.54 mm);

rod 132 for clamping of the strip in the feeding slot 36 of selector 126;

rod 133 for cutting-out of the center- and top carrying strip of the pin;

rod 134 for clamping of the pin to be cut off;

rod 135 for the movement of anvil 136 for cutting of the central carrying strip of the pin.

The feeding and clamping of the strip by the rods 131 and 132 is done by known means normally used for the feeding of one single strip with pre-cut pins and which are not discussed in this description.

To cut off the pin supplied the bottom side of the feeding slot 36 must be at the same level as the upper side of the fixed gripping finger 122 of arm 24a.

Rod 133 is connected at the bottom by means of a coupling connector 139 with a knife 138 which is located between clamp 140 and selector 126.

This clamp 140 is connected in 140 to rod 134 and is subject to the pressure of a spring 142.

Figure 10:
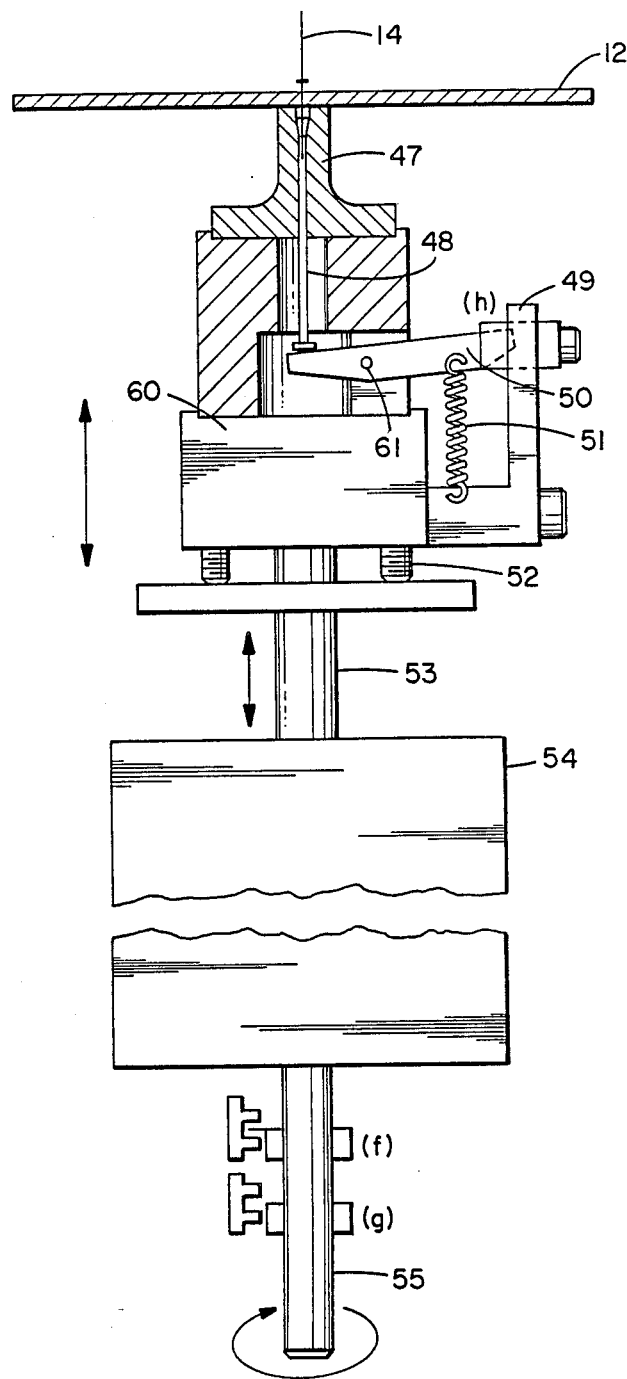
FIG. 10: is a side view of the anvil mechanism at the bottom of the X-Y table.

Rod 135 is connected by means of a connecting piece 137 to a slide 143 at the upper side of which anvil 144 is fixed. In the anvil, which serves for cutting out the central carrying strip of the pin, an exhaust pipe 145 is mounted for the removal of the cut-off carrying strip and burrs, if any. Between each of the separate rods 131, 132, 133, 134 and 135 and their mutual connecting- or coupling pieces 137, 139 and 141 an appropriate thread and nut connection is provided in order to enable the adjustment of the separate movements. An anvil mechanism 80 under X-Y table 10 is shown in FIG. 10.

This mechanism is driven by a rotating shaft 55 which is driven by a DC-motor (not shown in the figure) and which extends towards the inside of a housing 54.

Inside housing 54 is a known type of cam mechanism, which converts the rotating movement of the incoming shaft 55 into an up-and-downward movement of an outgoing shaft 53.

This outgoing shaft 53 is connected to the frame 60 of anvil 47 by means of regulating screws.

During the insertion of a pin 14 anvil 47 must be located against the bottom of printed circuit plate 12 in order to prevent the deflection of same.

During the movement of X-Y table 10 anvil 47 must withdraw, however, till under the pin section in order to prevent any contact with the pins already inserted.

Anvil 47 is further equipped with a mechanism to control and confirm the presence of the pin during the insertion.

For that purpose a small pin 48 is moved downward during the insertion of a pin 14 into plate 12. This small pin then pushes against a lever 50 which pivots around its hinge point 61.

The other end of lever 50 moves past a detector (h) which is mounted on a support 49. The detector then confirms the presence of a pin in this place in plate 12.

When anvil 47 moves downward again, spring 51 pulls lever 50 out of the scope of the detector (h).

With the regulating screws 52 the height of the anvil can be adjusted. It must be adjusted in such a way that it touches in its upper position the bottom of printed circuit plate 12.

For the operation and control of the various parts of the machine optical detectors are mounted, for example: on incoming shaft 102 of distribution head 20 (FIG. 5)

(a) "distribution head in position"—starting position of the mechanism of the distribution head.

(b) "distribution head in free-running position"—when this point is reached, table 10 may only start moving and transfer plate 12 to the next position programmed.

(c) "ready for gripping of pin"—gives the start signal to the mechanism to return to its starting position ("feeding withdrawn")

(d) "arm of distribution head down"—at this moment the insertion movement is terminated and the start signal is given to control the continuity;

on incoming shaft 42 of the cutting mechanism (FIG. 9)

(e) "feeding withdrawn": starting position of the cutting mechanism.

on incoming shaft 55 of anvil 47 (FIG. 10)

(f) "anvil down"

(g) "anvil up"

on anvil chassis 60 (support 49 in FIG. 10)

(h) "continuity test": confirms the presence of a pin in plate 12.

The position of all these abovementioned detectors can be controlled continuously on control panel 15 (FIG. 2) by means of telltale lamps or socalled LEDs.

LEDs are also fitted to check the position of selector 126 for magazine 30, viz. "upper limit", "zero position" and "lower limit".

Course of a cycle:

machine in zero position:

After having pressed the "zero" key we obtain on the one hand the movement of table 10 in X- and Y-direction; on the other hand the movement of selector 126 to its starting position. In order to go to the zero position the following conditions must be fulfilled:

Cutting mechanism 39 (FIG. 9) in position "feeding withdrawn". This is the position of the cutting mechanism just before the beginning of the feeding movement.

Distribution head 20 in position and in free-running condition.

Anvil 47 down.

Limit lamp must go out after the zero key is pressed. If this does not happen, table 10 or selector 126 are in the limit position.

To check whether these conditions are fulfilled, a panel 15 with LED-indicators is installed on the machine as shown in FIG. 2. The first three conditions are displayed thereon. The fourth condition is indicated on the control panel. If one of these conditions is not fulfilled, this must be readjusted manually.

After the last of the three, X-Y or the selector have reached their zero position, they make a short movement towards the machine.

On the control panel we then see that the indications "program ready" and "start program" are lit.

Program start:

When we press this key table 10 moves towards its parking position and selector 12 to the first programmed position.

That is the position in which back-panel 12 can be fixed on table 10.

When the machine is started, this must always be done from "zero" through "Program start", in order to be sure that we start at the beginning of a program.

Start:

After pressing this key the table moves to the first position.

When the table is in position, the start signal is given for "anvil up" and "pin feeding".

The anvil starts to move till it rests against plate 12; a pin from the strip which is in front of the cutting mechanism, is pushed forward.

The stopping of the "pin feeding" indicates the start for the movement of the distribution head 20.

When arm 24a which is going to pick up the pin 14 located in the cutting mechanism, is in the proper position in which detector (c) signals "ready for gripping pin", cutting mechanism 39 starts for the second time to move towards the "feeding withdrawn" position.

Here the pin is clamped, cut off and released again. As the distribution head mechanism does not stop here, the cutting mechanism must already be in the "feeding withdrawn" position before arm 24a whichs picks up the pin, moves backward again. This is a matter of speed adjustment of motor 22 which drives distribution head 20.

The distribution head mechanism terminates its run and brings the pin which it picked up above plate 12.

The movement of table 10 occurs when the detector (b) activates the switch for "distribution head in free-running position". This happens at the moment when arm 24b during the upward movement is outside the pin area.

At the same time when a pin is picked up, an other one is inserted (except during the picking-up of the first pin at the beginning of the program).

When the pin has been inserted and has consequently reached its depth, detector (d) activates the switch for "distribution head arm down".

This has a double function:
Start for "anvil down (f)".
Checking the continuity (h).
Also during the insertion detector (h) activates the switch for "continuity test".

This switching is done by the pin itself. It must be activated before the detector (h) activates the switch for "distribution head arm down", as this one gives the starting signal for the continuity testing.

Continuity fault:
In case for any reason whatsoever there is no pin notwithstanding one has been programmed, the detector (h) does not activate the switching for "continuity test" and the display indicates "continuity fault". A signal lamp on the control panel lights up and the machine stops. In case of a "continuity fault" a visual control by the operator is necessary in order to find out what happened:

It is possible that the pin has been bent and in most cases it will then be in arm 24 on the left side. This pin must then be removed.

It is possible that a pin has not been picked up and is still in the cutting mechanism 39, from where it must also be removed.

When everything is in good order again, the "restart" key must be pushed and the machine will continue to operate normally.

Restart:
When the "restart" key is pressed the co-ordinates of the position where no pin has been inserted remain stored in the memory till plate 12 which lies on the machine has been completely finished.

After the finishing of the back-panel the machine moves to its parking position in case there are no "restarts" or "repairs". If any repairs have to be carried out, the machine stops at the end of plate 12. After the start-key is pressed, it will start to insert the appropriate pins in all the positions where we must have pushed on the "restart"("repair") key. After having finished all this repairwork the table moves to its parking position.

Feeding error:
When the signal lamp "feeding error" lights up, the machine stops. Then there are two possibilities:

No pin has been fed:
The cutting mechanism is in the "feeding withdrawn" position. Check whether the selected strip has been used up. If necessary fix a new strip.
Push the "feeding" key and the cycle will continue.
There is still a pin in arm 24 on the left side of the distribution head.
Remove this pin and press the "start" key again to continue the cycle.

What is claimed is:

1. Machine for automatic and selective insertion of electrical contact pins of different kinds or coating in previously programmed places into a printed circuit plate with the characteristic that this machine is equipped with:
    a programmable X-Y table 10 on which the printed circuit plate (12) is fixed;
    an intermittently rotatable distribution head (20) fixed on this table (10) equipped with a mechanism comprising at least two arms, each of said arms having means for picking up a contact pin (14) from a feeding device (30) and for insertion of this pin into a printed circuit plate fixed on the X-Y table;
    a lever mechanism (103, 105) for simultaneously acting on said at least two arms (24a, 24b) in a pin pick-up position and a pin insertion position, respectively:
    a feeding device (30) which is movable in lateral direction with respect to the distribution head (20) for the automatic and selective feeding of at least two different types of pins and equipped with a mechanism for the separate cutting from the feeding strip of a pin and for the orientation and alignment of this pin; and
    an anvil mechanism (80) attached under the X-Y table (10) to stop the pin at the bottom side of the printed circuit plate (12).

2. Machine according to claim 1 with the characteristic that the distribution head (20) is equipped with a number of radially mounted arms (24) and rotates intermittently over a certain angle in such a way that each time in an immobile position of the distribution head at least one of the arms (24a) is in a position for picking up a selected pin from the magazine (30), whereas at least one other arm (24b) is in a position for inserting a previously picked-up pin into the printed circuit plate (12).

3. Machine according to claim 1, with the characteristic that the distribution head (20) and the lever mechanism are driven by a same driving mechanism (22, 109, 101).

4. Machine according to claim 3 with the characteristic that the lever mechanism consists of a lever (103) mounted on top of the distribution head (20) and which can revolve around a spindle (113), the front end of the lever (103) being connected by a hinged coupling to a vertical slide (105) which extends in front of the distribution head and the rear of the lever (103) being connected by a hinged coupling to an actuating rod (104) driven by the driving mechanism (22, 109, 101) of the distribution head (20).

5. Machine according to claim 4 with the characteristic that the vertical slide (105) operates in concert by means of an oblique groove (116) with a tooth (117) forming part of a cross-slide (106), each of the slides (105, 106) being equipped with means to work in concert during their simultaneous movement with two arms (24a, 24b) which are respectively in the pick-up position and in the insertion position.

6. Machine according to claim 5 with the characteristic that the slides (106, 105) work in concert with the respective arms (24a, 24b) by means of projections (121) which are fitted to each arm (24) and which each engage separately in a groove segment (119, 120) of the respective slides (106, 105); these mutual groove segments (119, 120) form part during the rest position, during which the distribution head can freely revolve, of a circular groove (118) which is provided in both slides (106, 105) and in which the projections (121) of each arm (24) can freely move.

7. Machine according to claim 2 with the characteristic that each arm (24) is equipped with a fixed finger (122) and a finger (123) pivoting around a spindle (124), in which the hinged finger is equipped on the back side with a pawl (108) and is pressed in normal position against the fixed finger (122) by a spring (125).

8. Machine according to claim 7 with the characteristic that the pawl (108) fixed at the back of the hinged finger (123) can work in concert with the profile of a cam (107), if this cam is in a advanced forward position for opening of the fingers (122, 123); in an advanced backward position of the cam (107) the profile of the latter is out of reach of the pawl (108) and consequently the fingers remain closed.

9. Machine according to claim 4 with the characteristic that the spindle (113) around which the lever (103) can oscillate is mounted in a slide (112) which can move in longitudinal direction with respect to the lever (103) in order to obtain a possibility to adjust the insertion depth of the pin (14) into a plate (12).

10. Machine according to claim 1 with the characteristic that the feeding mechanism (30) which is laterally movable with respect to the distribution head (20) is equipped with a vertically movable selector (126) in which a number of guiding grooves (36) have been provided for the feeding of strips with pre-cut contact pins (14) of different kinds or with a different coating.

11. Machine according to claim 10 with the characteristic that the feeding device (30) is equipped with a feeding- and cutting mechanism (38, 39), which consists in principle of a cam-operated mechanism (130) which works in concert with various rods which respectively take care of the feeding (131) of the selected strip, the clamping (132) of this strip in the guiding groove, the cutting-out of the central- and top carrying strip of the pin, the clamping and straightening (134) of the pin to be cut off and the movement (135) of the anvil (136) for the cutting of the central carrying strip of the pin.

12. Machine according to claim 1 with the characteristic that the anvil mechanism (80) consists in principle of an anvil (47) fixed on a frame (60) which can move up and down by means of a shaft (53) which forms part of a mechanism (54) which converts a rotary movement of the incoming shaft (55) into an up and downward movement of the outgoing shaft (53)

13. Machine according to claim 12 with the characteristic that the anvil (47) is equipped with a means to check and confirm the presence of a pin, consisting of a small spindle (48) which is centrally fixed in the anvil in the longitudinal axis of the inserted pin. This spindle is mounted on a lever (50) which is subject to the influence of a spring (51) and with which an electronic detector can operate in concert.

14. Machine according to claim 1 with the characteristic that all rotating driving shafts of the various mechanisms (20, 30, 39, 80) are fitted with electronic detectors (a, b, c, d, e, f, g) for the operation and control of the mechanisms.

* * * * *